(12) United States Patent
Rappe et al.

(10) Patent No.: US 8,603,573 B2
(45) Date of Patent: Dec. 10, 2013

(54) FERROELECTRIC ULTRATHIN PEROVSKITE FILMS

(75) Inventors: Andrew M. Rappe, Penn Valley, PA (US); Alexie Michelle Kolpak, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 665 days.

(21) Appl. No.: 12/517,163

(22) PCT Filed: Dec. 3, 2007

(86) PCT No.: PCT/US2007/086316
§ 371 (c)(1),
(2), (4) Date: Jul. 6, 2010

(87) PCT Pub. No.: WO2008/133740
PCT Pub. Date: Nov. 6, 2008

(65) Prior Publication Data
US 2010/0291378 A1    Nov. 18, 2010

Related U.S. Application Data

(60) Provisional application No. 60/872,273, filed on Dec. 1, 2006.

(51) Int. Cl.
*G11B 5/65*    (2006.01)
(52) U.S. Cl.
USPC ............................................. 427/100; 427/58
(58) Field of Classification Search
USPC ..................... 427/100, 58; 257/259
See application file for complete search history.

(56) References Cited

U.S. PATENT DOCUMENTS

| | | | |
|---|---|---|---|
| 5,168,420 A | | 12/1992 | Ramesh et al. |
| 5,446,688 A | * | 8/1995 | Torimaru ...................... 365/145 |
| 5,479,317 A | * | 12/1995 | Ramesh .................... 361/321.5 |
| 5,519,235 A | * | 5/1996 | Ramesh ........................ 257/295 |
| 6,204,525 B1 | | 3/2001 | Sakurai et al. |

OTHER PUBLICATIONS

"Thermophysical Properties of Matter", edited by Y.S. Touloukian. Plenum, NY, 1977, 13, 670-673.
Batra et al., "Depolarization Field and Stability Considerations in Thin Ferroelectric Films", J. Vac. Sci. Technol., Sep./Oct. 1973, 10(5), 687-692.
Bungaro et al., "Coexistence of antiferrodistortive and ferroelectric distortions at the $PbTiO_3$ (001) surface", Phys. Rev. B, 71, Jan. 26, 2005, 035420-1-035420-9.
Choi et al., "Growth mode transition from layer by layer to step flow during the growth of heteroepitaxial $SrRuO^3$ on (001) $SrTiO_3$", Appl. Phys. Lett., Sep. 3, 2001, 79(10), 1447-1449.
Dulub et al., "Novel stabilization mechanism on polar surfaces: $ZnO(0001)$-Zn", Phys. Rev. Lett., Jan. 10, 2003, 90(1), 016102-1-016102-4.

(Continued)

*Primary Examiner* — Michael Cleveland
*Assistant Examiner* — Tabassom Tadayyon Eslami
(74) *Attorney, Agent, or Firm* — Woodcock Washburn, LLP

(57) ABSTRACT

Disclosed herein are perovskite ferroelectric thin-film. Also disclosed are methods of controlling the properties of ferroelectric thin films. These films can be used in a variety materials and devices, such as catalysts and storage media, respectively.

7 Claims, 9 Drawing Sheets

(56) References Cited

OTHER PUBLICATIONS

Fong et al., "Direct structural determination in ultrathin ferroelectric films by analysis of synchrontron x-ray scattering measurements", Phys. Rev. B, 71, Apr. 27, 2005, 144112-1-144112-11.

Fong et al., "Stabilization of Monodomain Polarization in Ultrathin $PbTiO_3$ Films", Phys. Rev. Lett., Mar. 31, 2006, 96(12), 127601-1-127601-4.

Fong et al., "Ferroelectricity in ultrathin perovskite films", Science, Jun. 2004, 304(5677), 1650-1653.

Glazer et al., "Powder profile refinement of lead zirconate titanate at several temperatures II. Pure $PbTiO_3$", Acta Crystallogr., B, Apr. 1978, 34(4), 1065-1070.

Grigoriev et al., "Nanosecond domain wall dynamics in ferroelectric $Pb(Zr,Ti)O_3$ thin films", Phys. Rev. Lett., May 12, 2006, 96(18), 187601-1-187601-4.

Hlinka, "Viewpoint: Switching a ferroelectric film by asphyxiation", Physics 2, 8, published Jan. 6, 2009, 3 pages.

Junquera et al., "Critical thickness for ferroelectricity in perovskite ultrathin films", Nature, Feb. 2003, 422(6931), 506-508.

Kalinin et al., "Domain polarity and temperature induced potential inversion on the $BaTiO_3$ (100) surface", J. Appl. Phys., Mar. 15, 2002, 91(6), 3816-3823.

Kalinin et al., "Local potential and polarization screening on ferroelectric surfaces", Phys. Rev. B, 63, Mar. 13, 2001, 125411-1-125411-13.

Kornev et al., "Ultrathin films of ferroelectric solid solutions under a residual depolarizing field", Phys. Rev. Lett., Nov. 5, 2004, 93(19), 196104-1-196104-4.

Lichtensteiger et al., "Ferroelectricity and tetragonality in ultrathin $PbTiO_3$ films", Phys. Rev. Lett., Feb. 4, 2005, 94(4), 047603-1-047603-4.

Munkholm et al., "Antiferrodistortive Reconstruction of the $PbTiO_3$ (001) Surface", Phys. Rev. Lett., 2002, 88(1), 016101-1-016101-4.

Murty et al., "In Situ X-Ray Scattering Study of PbTiO3 Chemical Vapor Deposition", Appl. Phys. Lett., Mar. 11, 2002, 80(10), 1809-1811.

Nagarajan et al., "Size effects in ultrathin epitaxial ferroelectric heterostructures", Appl. Phys. Lett., Jun. 21, 2004, 84(25), 5225-5227.

Ohtomo et al., "A high-mobility electron gas at the $LaAlO_3/SrTiO_3$ heterointerface", Nature, Jan. 4, 2004, 427(6973), 423-426.

Pertsev et al., "Effect of Mechanical Boundary Conditions on Phase Diagrams of Epitaxial Ferroelectric Thin Films", Phys. Rev. Lett., Mar. 2, 1998, 80(9), 1988-1991.

Pertsev et al., "Polarization instability in polydomain ferroelectric epitaxial thin films and the formation of heterophase structures", Phys. Rev. Lett. Apr. 17, 2000, 84(16), 3722-3725.

Peter et al., "Piezoresponse in the light of surface adsorbates: Relevance of defined surface conditions for perovskite materials", Appl. Phys. Lett., Oct. 4, 2004, 85(14), 2896-2898.

Ramesh et al., "Orienting ferroelectric films", Science, Materials Science, Jun. 14, 2002, 296(5575), 1975-1976.

Rijinders et al., "Enhanced surface diffusion through termination conversion during epitaxial $SrRuO_3$ growth", Appl. Phys. Lett, Jan. 25, 2004, 84(4), 505-507.

Sai et al., "Ferroelectricity in ultrathin perovskite films", Phys. Rev. B, 72, Jul. 7, 2005, 020101-1-020101-4.

Stephenson et al, "Real-Time X-Ray Scattering Studies of Surface Structure During Metalorganic Chemical Vapor Deposition of GaN", MRS Bulletin, Jan. 1999, 24(1), 21-25.

Stephenson et al., "In situ X-ray studies of vapor phase epitaxy of $PbTiO_3$", Physica B, Jan. 2003, 336(1), 81-89.

Stephenson et al., "Theory for equilibrium 180° stripe domains in $PbTiO_3$ films", J. Appl. Phys., Sep. 7, 2006, 100(5), 051601-1-051601-17.

Streiffer et al., "Observation of nanoscale 180 degrees stripe domains in ferroelectric $PbTiO_3$ thin films", Phys. Rev. Lett., Aug. 2002, 89(6), 067601-1-067601-4.

Thompson et al., "Observation of the polarization of domains in ferroelectric thin films using x-ray interference", Appl. Phys. Lett., Dec. 15, 1997, 71(24), 3516-3518.

Tybell et al., "Ferroelectricity in thin perovskite films", Appl. Phys. Lett., Aug. 9, 1999, 75(6), 856-858.

\* cited by examiner

FERROELECTRIC ULTRATHIN PEROVSKITE FILMS

CROSS REFERENCE TO RELATED APPLICATIONS

This application is the National Stage of International Application No. PCT/US2007/086316, filed Dec. 3, 2007, which claims the benefit of U.S. Provisional Application No. 60/872,273, filed Dec. 1, 2006, the disclosures of which are incorporated herein by reference in their entireties.

STATEMENT OF GOVERNMENT INTERESTS

The invention was made with U.S. Government support. The Government may have certain rights in the invention under U.S. Department of Energy, Office of Science, Basic Energy Sciences under Contract No. W-31-109-ENG-38, NSF DMR-0313764, ECS-0210449, ONR N00014-00-1-0372, N00014-01-1-0365 and AFOSR FA9550-04-1-0077.

FIELD OF THE INVENTION

The disclosed invention pertains to the field of ferroelectric films. The disclosed invention also pertains to perovskite compositions. The disclosed invention is also in the field of switchable perovskite films. The disclosed invention also pertains to the field of storage media and catalysis.

BACKGROUND OF THE INVENTION

One of the outstanding fundamental needs for ferroelectric thin films is developing a stable polar phase when the polarization has a component perpendicular to the film plane. Although such orientations are desired for many applications and can be obtained (e.g., by compressive epitaxial strain), the polarization change at the film boundaries creates a "depolarizing field" that should be neutralized for the polar phase to be stable. Two mechanisms appear to be available to reduce the depolarizing field energy: compensation by free charge at the boundaries or the formation of equilibrium stripe domains with oppositely oriented polarization. In both cases, the trade-off between bulk energy gain and surface energy cost leads to a suppression of the phase transition to the polar phase as films become thinner. These fundamental size effects may dramatically alter behavior in ultrathin films.

SUMMARY OF THE INVENTION

Accordingly, one aspect of the present invention provides methods of reversibly switching the polarization of a ferroelectric film by changing the chemical environment in contact with one surface of a ferroelectric film. In these methods, the chemical environment can be changed by controlling the oxygen partial pressure in contact with the ferroelectric film. For example, the change in oxygen partial pressure induces an outward or inward polarization, respectively, in the ferroelectric film. In other embodiments, the ferroelectric film comprises a perovskite thin-film. Suitable perovskite thin-films comprises $PbTiO_3$. In the other types of perovskite and films can also be utilized. Suitably, the ferroelectric film is supported on a conducting substrate. In particularly preferred embodiments, the ferroelectric films are thinner than 10 nm, and typically at least about 1 nm.

Another aspect of the present invention provides ferroelectric thin-film comprising a perovskite film thinner than 10 nm supported on a conducting substrate, the perovskite film comprising polar ground states in the presence of ionic adsorbates. Suitable perovskite thin-films comprise $PbTiO_3$. In other embodiments, the conducting substrates can comprise strontium ruthenium oxide or strontium titanium oxide. A suitable film thickness is greater than or about 1.2 nm. In certain preferred embodiments, the conducting substrate comprises an epitaxial conducting film. These ferroelectric thin films have uses in switchable catalysts and storage media.

The present invention also provides methods of inverting a domain in a ferroelectric thin-film, comprising applying a voltage to a probe tip adjacent to the ferroelectric thin-film. For example, in these methods the ferroelectric thin-film can comprise a perovskite film thinner than 10 nm supported on a conducting substrate, the perovskite film comprising polar ground states in the presence of ionic adsorbates. Suitable perovskite thin-films comprise $PbTiO_3$. In other embodiments, the conducting substrates can comprise strontium ruthenium oxide or strontium titanium oxide. A suitable film thickness is greater than or about 1.2 nm. In certain preferred embodiments, the conducting substrate comprises an epitaxial conducting film.

Another aspect of the present invention provides methods of writing a data bit in a ferroelectric thin-film, comprising: applying a voltage to a probe tip adjacent to the ferroelectric thin-film. For example, in these methods the ferroelectric thin-film can comprise a perovskite thin-film thinner than 10 nm supported on a conducting substrate, the perovskite film comprising polar ground states in the presence of ionic adsorbates. Suitable perovskite thin-films comprise $PbTiO_3$. In other embodiments, the conducting substrates can comprise strontium ruthenium oxide or strontium titanium oxide. A suitable film thickness is greater than or about 1.2 nm. In certain preferred embodiments, the conducting substrate comprises an epitaxial conducting film.

In another aspect, the present invention also provides methods for reducing the Curie temperature of a ferroelectric thin-film, comprising: reducing the thickness of the ferroelectric thin-film to less than 10 nm.

In yet other aspects, the present invention also provides methods of stabilizing the polar state in a thin-film, comprising: absorbing ions onto the thin-film surface. For example, in these methods the surface charge is passivated by adsorbing an adsorbate. Suitable thin-films comprise a ferroelectric material characterized as having a mono-domain state.

The present invention also includes aspects which include methods for electrically switching the reactivity of a ferroelectric thin-film surface, comprising: applying a voltage adjacent to the ferroelectric thin-film. A suitable ferroelectric thin-film comprises a perovskite film thinner than 10 nm supported on a conducting substrate. For example, the perovskite film may comprise polar ground states in the presence of ionic adsorbates.

Using in situ high-resolution synchrotron x-ray scattering, the Curie temperature $T_C$ has been determined for ultrathin c-axis epitaxial PbTiO3 films on conducting substrates (SrRuO3 on SrTiO3), with surfaces exposed to a controlled vapor environment. The suppression of TC was relatively small, even for the thinnest film (1.2 nm). We observe that 180° stripe domains do not form, indicating that the depolarizing field is compensated by free charge at both interfaces. This is confirmed by ab initio calculations that find polar ground states in the presence of ionic adsorbates.

Here we focus on stabilization of the single-domain state in ultrathin ferroelectric perovskite films by interfacial charge. Key issues are determining the critical thickness, below which the monodomain, perpendicularly polarized state is not stable, and understanding the nature of the interfacial charge compensation. Previous experimental studies of ultrathin epitaxial films on conductive substrates have been carried out using electrical measurements, piezoresponse force microscopy (PFM), and x-ray lattice parameter measurements. These studies have found stable monodomain ferroelectricity at room temperature in films as thin as 3-4 nm. Lattice parameter measurements indicated a 50% reduction in PbTiO3 polarization when film thickness was reduced to 3 nm, which was explained using a model based on the finite screening length for charge in conducting electrodes. Interestingly, in some of these studies, the film did not have an electrode on the exposed surface. Interface compensation adequate to stabilize ultrathin polar films can occur by a mechanism other than electronic conduction, e.g., by the accumulation of charged ions. For relatively thick ferroelectric films exposed to ambient atmosphere, there is strong experimental evidence for surface compensation by ionic adsorption. Furthermore, monodomain ferroelectric films have been observed on nonconducting substrates, and it has been proposed that high-mobility electrons can exist at heterointerfaces in perovskite insulators due to unusual bonding states. The adequacy of these alternative, "chemical" rather than "electronic" mechanisms for reducing depolarization field energy sufficiently to stabilize ultrathin polar films is relatively unexplored.

Using real-time x-ray scattering, we also observe that the direction of polarization in a ferroelectric thin film can be reversibly switched by changing the oxygen partial pressure in equilibrium with its surface.

The reorientable spontaneous electric polarization of ferroelectric materials gives them unusual dielectric properties and utility for information storage. Polarization orientation is typically switched by applying a voltage across electrodes. Here we report real-time synchrotron x-ray scattering experiments showing that the polarization can also be reversibly switched by changing the chemical environment in contact with one surface of a ferroelectric film. High or low oxygen partial pressure induces outward or inward polarization, respectively, in a PbTiO3 film. Such chemical switching provides a new mechanism for manipulation of ferroelectric domain patterns and for novel applications such as chemical actuators and active catalysts.

DETAILED DESCRIPTION OF ILLUSTRATIVE EMBODIMENTS

Described herein is the paraelectric-ferroelectric phase transition in ultrathin PbTiO3 films grown on conducting substrates, with surfaces exposed to a controlled vapor environment. The structures of films as thin as 1.2 nm (3 unit cells) were determined as a function of temperature (T) using high-resolution grazing-incidence x-ray scattering. The polar phase was observed to form and remain single domain for all thicknesses studied (1.2-9.2 nm). The observed stability of the monodomain phase is explained by ab initio calculations that find a polar ground state if ionic adsorbates are present on the surface. The polarization direction depends on the chemical nature of the adsorbate.

The conducting substrates were epitaxial SrRuO3 films grown on SrTiO3(001) single crystals by pulsed laser deposition. The PbTiO3 films were grown by metalorganic chemical vapor deposition (MOCVD) under conditions described previously. Grazing-incidence synchrotron x-ray scattering was used for in situ monitoring of the film during epitaxial growth and for subsequent observation of the phase transition as a function of T. This method allows study at high T while maintaining film stoichiometry and a well-controlled vapor interface and the study of ferroelectricity in films too thin to be characterized by other methods. Four PbTiO3 films of different thickness were studied: Three of the films (1.2, 2.0, and 3.6 nm) were grown at 930 K on 10-nm-thick SrRuO3 layers; the thickest PbTiO3 film (9.2 nm) was grown at 990 K on a 50-nm-thick SrRuO3 layer. All of the layers replicated the high crystalline quality of the substrates (0.01° typical mosaic) and were measured to be fully lattice matched to the underlying SrTiO3. This compressive epitaxial strain produces polarization perpendicular to the film plane.

Figure 1:
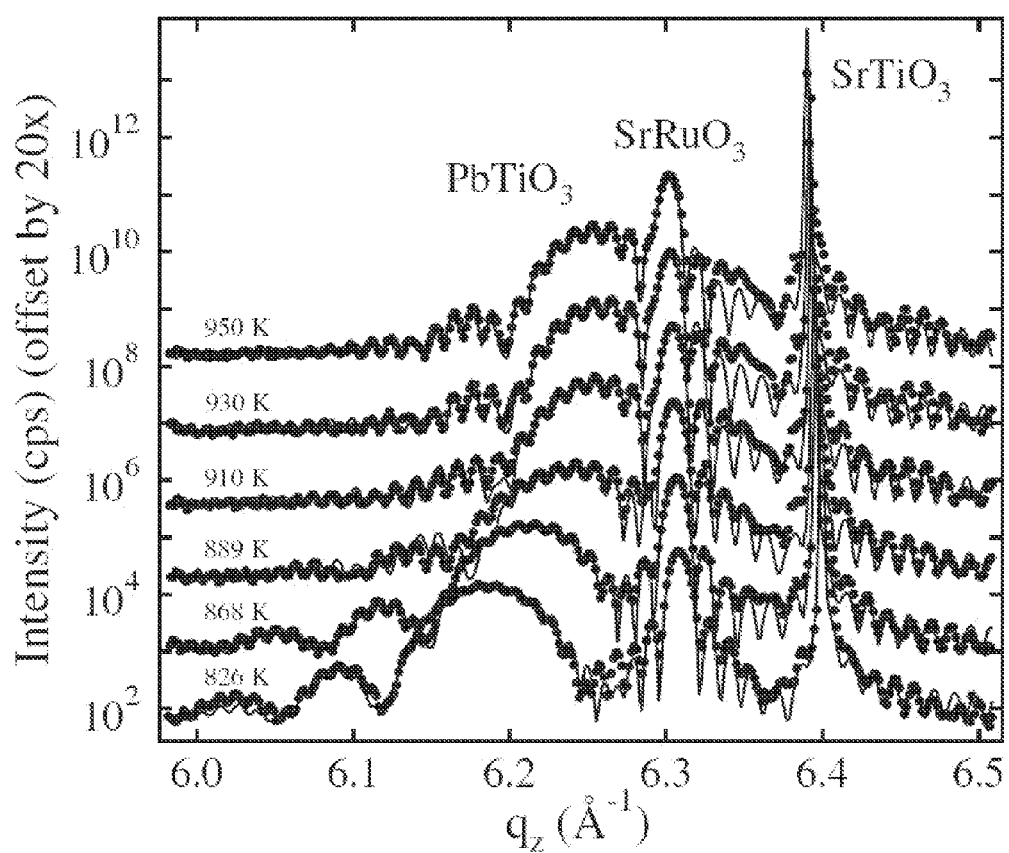
FIG. 1. Shows X-ray scattering intensity along the 30 L CTR, showing the 304 Bragg peaks and finite-thickness fringes from 9.2-nm thick PbTiO3 and 50-nm-thick SrRuO3 films at various temperatures. The shift of the PbTiO3 peak to lower $q_z$ upon cooling indicates an expansion of the c lattice parameter.

X-ray experiments were carried out at beam line 12ID-D of the Advanced Photon Source, as described previously in S. K. Streiffer, et al., *Phys. Rev. Lett.* 89, 067601 (2002). The Curie temperature TC was determined by measuring the T dependence of the c (out-of-plane) lattice parameter. FIG. 1 shows measurements along the 30 L crystal truncation rod (CTR) for a 9.2 nm- (23 unit-cell-) thick PbTiO3 film at various temperatures. This region of the CTR extends through the 304 peaks of PbTiO3, SrRuO3, and SrTiO3. From the position of the PbTiO3 peak, one can see that c increases as the film polarizes below TC, because of the strong polarization-strain coupling in this system [2]. The many fringes observed from the thicknesses of the SrRuO3 and PbTiO3 layers indicate the high quality of the interfaces.

For the 9.2 nm film, we also performed ex situ room-T PFM. We were able to "write" inverted domains by applying a positive voltage to the tip and to determine that the as grown state of the film was a single domain having a polarization directed out of the film ("up" polarization). For all films, we searched in situ near TC for satellites in the diffuse x-ray scattering around the PbTiO3 Bragg peaks, which occur when equilibrium 180° stripe domains are present. None were observed, indicating that all the films transform directly into the monodomain polar state.

Values for the PbTiO3 lattice parameter c as a function of T were determined by fitting the x-ray CTR data to a 3-layer model (two films and a substrate). For the fits shown here, we assumed that the PbTiO3 polarization direction is up, with the square of atom displacements proportional to the change in c from its P=0 value, and that the SrRuO3 is SrO terminated and the PbTiO3 is PbO terminated. Changing these assumptions does not significantly affect the results for c. For each sample, the numbers of PbTiO3 and SrRuO3 unit cells were fixed. Eight parameters were varied in the fitting procedure: lattice constants, layer roughnesses, and interface offsets for the SrRuO3 and PbTiO3 layers, a scale factor for the SrRuO3, and an overall scale factor for the total scattered intensity. This simple structural model is able to reproduce the CTR intensities very well for all thicknesses and temperatures. Typical best fits are shown with the data in FIG. 1.

Figure 2:
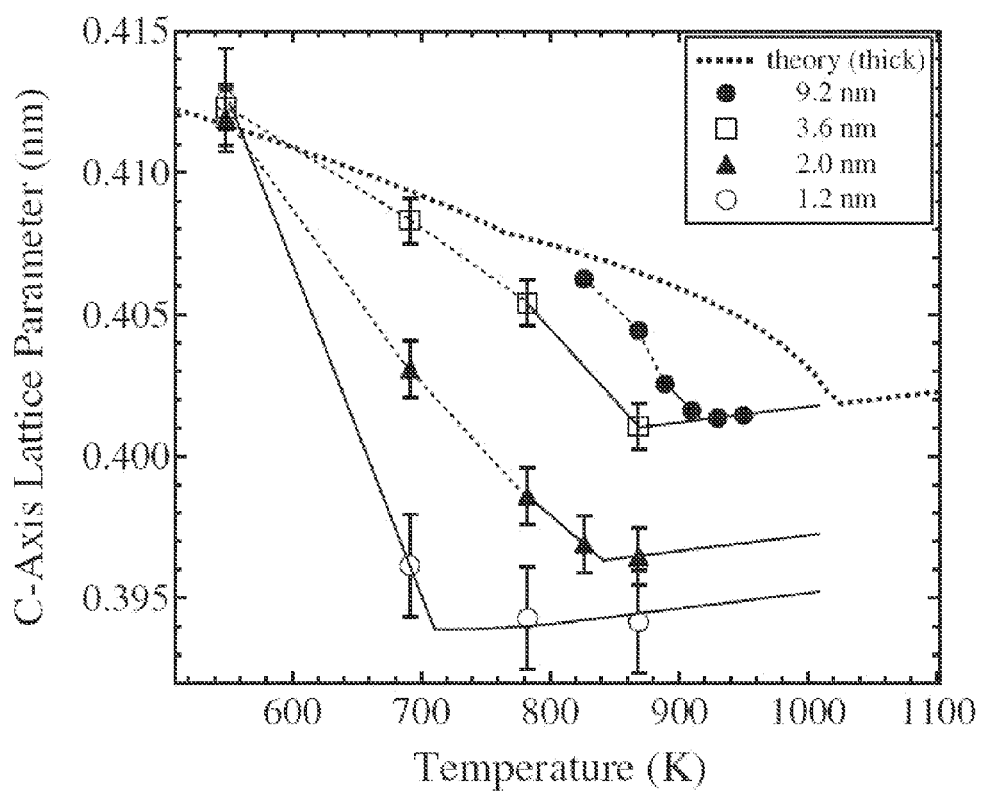
FIG. 2. Shows the c lattice parameter vs T for each film, with solid lines showing the break in slope used to estimate $T_C$. The upper curve is the Landau theory prediction for thick PbTiO3 on SrTiO3.

FIG. 2 shows the dependence of c on T for each film thickness, as well as the predicted T dependence of c for thick, coherently strained PbTiO3 lattice-matched to SrTiO3. In the thick limit, the (second order) nonpolar to polar transition is located at $T_C^\infty = 1025$ K, as indicated by the abrupt change in slope. We extracted $T_C$ for each film by estimating the temperature at which the slope of c(T) changed, as shown by the solid lines in FIG. 2. The theoretical slope was used above $T_C$. Since we have no data above $T_C$ for the 3.6 nm film, that estimate of $T_C$ is a lower bound.

These results stand in some contrast to recently reported room-T lattice parameters of PbTiO3 films on Nb-doped SrTiO3 substrates, which showed a decrease in c for thinner films. We see no change in c as a function of thickness at our lowest T (550 K), even for smaller thicknesses than previously measured, although there is a clear variation in $T_C$ with thickness. Note also that we observe a systematic change in c with thickness in the nonpolar phase. Caution should thus be used when relating c to polarization or $T_C$ suppression in ultrathin films using measurements at only one T.

Figure 3:
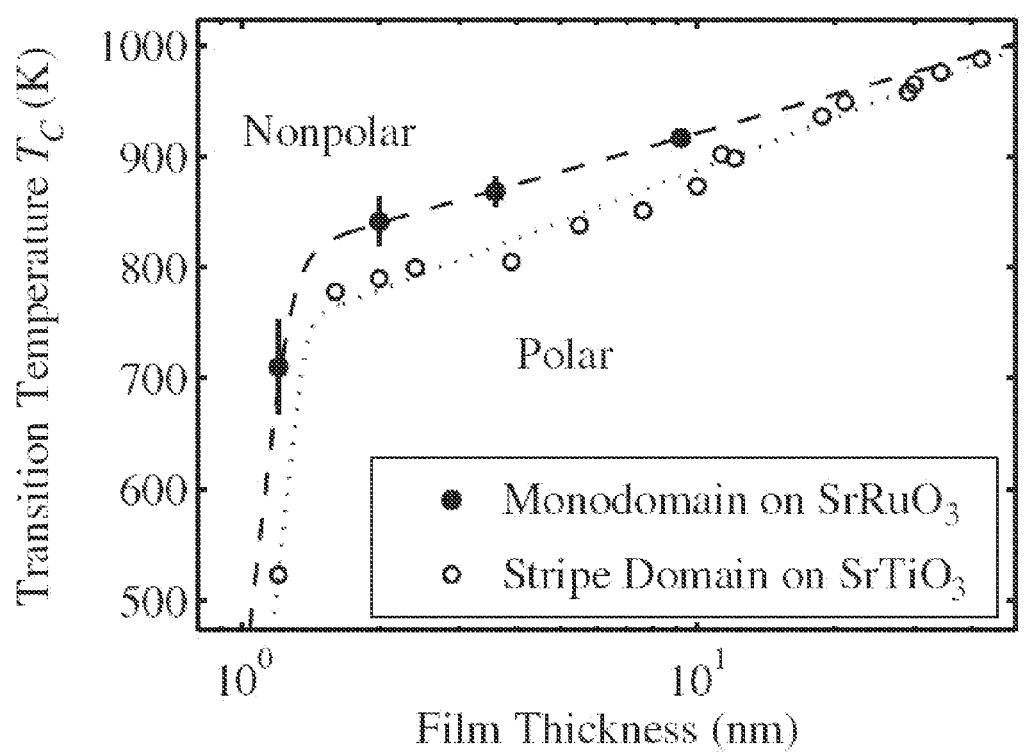
FIG. 3. Shows PbTiO3 $T_C$ vs film thickness for monodomain films on conducting SrRuO3 (this work) and stripe-domain films on insulating SrTiO3 (previous work, D. D. Fong, et al., Science 304, 1650 (2004)). Curves are guides to the eye.

The values of $T_C$ as a function of film thickness are shown in FIG. 3. Also shown are values of $T_C$ for PbTiO3 grown directly on insulating SrTiO3, in which 180° stripe domains have formed. In both cases, $T_C$ increases towards the calculated $T_C^\infty$ for thick films and decreases by hundreds of degrees below this limit for ultrathin films. The transition temperatures for PbTiO3 on SrRuO3 are somewhat higher than those on SrTiO3, in agreement with the observed difference in the equilibrium domain morphology: The conducting SrRuO3 electrode lowers the energy of the single-domain state, producing a direct transition from unpolarized to monodomain polarized at a higher $T_C$. The dependence of $T_C^\infty - T_C$ on film thickness we observe does not obey the power law predicted by the simplest theories of screening in electrodes but, instead, appears to be similar to that previously seen for films on insulating substrates.

The observation that polarization occurs without formation of 180° domains implies that both the top and bottom interfaces of these films should be almost completely compensated by free charge. Thus, a SrRuO3 electrode will compensate PbTiO3 with a voltage offset small enough that even a 3-unit-cell-thick film polarizes above room temperature. This is in agreement with recent ab initio calculations on films with two SrRuO3 electrodes. The behavior of the top surface is perhaps even more intriguing—although there is no conductor to supply electronic charge, exposure to the ambient vapor of the MOCVD growth environment evidently supplies sufficient free charge from ions to neutralize the depolarizing field.

To quantitatively verify whether adsorbed ions can stabilize the polar state in ultrathin films, we have performed ab initio density functional theory (DFT) calculations on the structure and energetics of PbTiO3 films on SrRuO3 bottom electrodes with various molecules adsorbed to the surface. Based on the composition of the MOCVD environment, we chose to study H, O, OH, $H_2O$, and $CO_2$ adsorption. Calculations were performed using methods described previously in Na Sai, A. M. Kolpak, and A. M. Rappe, Phys. Rev. B 72, 020101(R) (2005). We used DFT with the generalized gradient approximation as implemented in the ab initio code DACAPO, with ultrasoft pseudopotentials generated with the VASP code, a plane wave cutoff of 400 eV, a 4×4×1 Monkhorst-Pack k-point mesh, and an fast-Fourier-transform grid of 8 points/Å in all 3 directions. We modeled 3-unit-cell- (1.2-nm-) thick PbTiO3 films supported by 3 unit cells of SrRuO3, with a SrO—TiO2 interface between PbTiO3 and SrRuO3 and a PbO terminated PbTiO3 surface. A vacuum of >2 nm separated periodic copies of the structures in the direction perpendicular to the surface, and a dipole correction was included in the center of the vacuum region to remove the artificial electric field due to the asymmetry in "electrode" materials. The in-plane lattice constant was fixed to the calculated zero-stress a value for bulk PbTiO3, which approximates the effect of the SrTiO3 substrate in the experiments. Data are reported for films with one adsorbate on a single unit-cell surface area; modeling of the c(2×2) surface showed that the experimentally and theoretically determined reconstruction was present both with and without adsorbates but did not significantly affect the energy difference between the bare and adsorbed states.

For a bare surface, the ground state of the ferroelectric film was found to be nonpolar. With OH, O, or H adsorbates present, however, the ground state was polar, with atoms displaced from the centrosymmetric positions. Table I gives values of polarization relative to the theoretical bulk value $P_{bulk} = 0.75$ Cm$^2$, calculated from the average over all PbO and TiO2 layers of the cation-anion displacements $\Delta z = z_{cation} - z_O$, each divided by the corresponding $\Delta z$ in bulk theoretical PbTiO3. Since the conductive SrRuO3 electrode can provide either positive or negative compensation charge, the chemical nature of the adsorbate determines the direction of polarization. An overlayer of OH or O, which bind to the surface Pb, enforces an upwards polarization, while an overlayer of H, which bind to the surface O, stabilizes polarization in the opposite direction. On the other hand, $CO_2$ adsorption gives a very weak polarization, and undissociated H2O molecules bind only weakly to the surface, preserving the nonpolar state.

Table I also shows the differences in energy $\Delta E_{DFT}$ between the film with bound adsorbate and the separated bare film and free adsorbate atom (or OH molecule). To compare these T=0 K energies to experimental conditions, we estimated the standard Gibbs free energy of adsorption $\Delta G°(T)=\Delta H°(T)-T\Delta S°(T)$. The change in enthalpy $\Delta H°$ is estimated from $\Delta E_{DFT}$ by adding $P\Delta V \cong -k_B T$. A small correction for zero-point energy and spin polarization is also applied for the case of OH adsorption.

TABLE 1

Polarization and $\Delta E_{DFT}$ from DFT calculations, with estimated reaction energies per adsorbate at T = 300 K.

| Adsorbate | $P/|P_{bulk}|$ | $\Delta E_{DFT}$ (eV) | $\Delta H°$ (eV) | $\Delta G°$ (eV) | $\Delta G$ (eV) |
|---|---|---|---|---|---|
| OH | 0.7 | −2.00 | −2.34 | −1.96 | −0.20 |
| O | 0.9 | −0.92 | −0.95 | −0.52 | 1.95 |
| H | −0.8 | −2.90 | −2.93 | −2.65 | 0.79 |

The change in entropy $\Delta S_0$ is primarily due to the differences between the bound and free adsorbates. We estimated the entropy of the bound adsorbates and used tabulated entropies for free OH, O, and H at 1 bar [26]. Values of $\Delta G°$ at T=300 K are given in Table I. The free energy change under experimental conditions is $\Delta G=\Delta \tilde{G}°-k_B \tilde{T} \ln p_{exp}$, where $p_{exp}$ is the adsorbate partial pressure. For these experiments, the partial pressure of $O_2$ was controlled at $3.3\times 10^{-3}$ bar, while that of $H_2O$ varied between $2\times 10^{-6}$ and $1\times 10^{-9}$ bar depending upon the reactions of the MOCVD process gases. To obtain the values of $\Delta G$ in Table I, the partial pressures of free O, H, and OH at T=300 K were calculated using $p_{H2O}=5\times 10^{-7}$ bar. Inspection of these $\Delta G$ values shows that only OH adsorption is thermodynamically favored in our experimental environment.

The thermodynamic stability of OH adsorbates implies that the stable monodomain polarization direction is up, in agreement with the PFM result. The simple thermodynamic estimate presented here suggests that the full coverage of OH would desorb from the 3-unit-cell-thick film above T=450 K, resulting in a nonpolar film. Preliminary calculations that allow for partial coverage of OH give a higher transition T, in closer agreement with the observed $T_C$=700 K.

The DFT results presented herein verify that surface charge passivation by OH adsorbates is indeed adequate to stabilize the observed monodomain state in these films. For ultrathin films, the chemisorption energy of 2 eV is much larger than the bulk free energy difference between the polar and nonpolar states at zero field (e.g., 0.2 eV per unit-cell area for a 3-unit-cell-thick film). Such a strong influence of interfacial chemistry on polarization has broad implications for ultrathin ferroelectric films. To understand polarization stability, it is necessary for measurements to be performed with controlled interfacial chemistry. The behavior of ferroelectric films with exposed surfaces may differ significantly from those sandwiched between two electrodes. In the former case (e.g., PFM experiments), and without being bound by any theory of operation, it is believed that the switching mechanism likely involves a change in adsorbate. Charged impurities at buried interfaces may play a similar chemical role to the surface-adsorbed ions considered here. Exploitation of these effects for novel devices or templating techniques is possible, both through chemical control of polarity and through polarization control of ionic adsorption.

The ability to electrically switch the polarization of a ferroelectric film provides the basis for devices such as nonvolatile ferroelectric memories. A direction of recent research has been to understand the behavior of ultrathin films, for which interfacial effects begin to dominate over the physics of the film interior. For example, interface potentials due to finite electronic screening lengths and work functions should be considered when attempting to understand the stability of the polar state. These have large effects in ultrathin films because the electric field they produce scales inversely with film thickness. In particular, the voltage required to induce polarization reversal in ultrathin films is similar in magnitude to these interface potentials. Recent studies have shown that monodomain polarization can be stabilized in thin films not only through the presence of electrodes that provide electronic compensation at the film interfaces but also through surface-adsorbed ions or charged interfacial defects/impurities.

Compensation of ferroelectric surfaces by adsorbed ions can also be inferred from electric force microscopy measurements. This chemical nature of the environment interacts strongly with the polarization of thin films, since the electrochemical potential created by changes in the ambient becomes an alternative source of voltage to control film polarization. In particular, previous density functional theory calculations indicated that the electronegativity of adsorbates could determine the direction of polarization. Here, we use real-time synchrotron x-ray scattering to experimentally investigate changes in the polarization of $PbTiO_3$ films induced by varying the chemistry of the vapor above the film surface.

We observe that the sign of the polarization can be reversibly switched by changing the partial pressure of oxygen in equilibrium with the film surface. The dependence of film lattice parameter on oxygen partial pressure ($pO_2$) is bistable, following a "butterfly loop" analogous to that observed under applied voltage. The samples consist of 10-nm-thick $PbTiO_3$ films grown on $SrRuO_3$ films on $SrTiO_3$ (001) substrates (20). Both epitaxial films are coherently strained to the $SrTiO_3$ in-plane lattice parameter, forcing the polarization orientation in the $PbTiO_3$ to be perpendicular to the film plane. The conductive $SrRuO_3$ layer provides electronic compensation of the bottom interface of the $PbTiO_3$, while the top surface is exposed to a controlled vapor ambient. The equilibrium structure in an oxidizing environment is a monodomain state with positive polarization, i.e. with polarization vector pointing out of the surface.

Chemical switching experiments were carried out with the sample at temperatures in the range 550-950 K by exposing it to various $pO_2$ levels in a flowing nitrogen ambient with a constant total pressure of 13 mbar. Polarization switching was observed by using synchrotron x-ray scattering to directly monitor the atomic-scale structure of the ferroelectric film. By fitting a structural model to the complex scattering pattern produced by interference between nearby film and substrate Bragg peaks, we can extract not only the c-axis (surface normal) lattice parameter but also the fraction of positive domains in the $PbTiO_3$ film. The position of the $PbTiO_3$ Bragg peak gives the lattice parameter c, while its intensity is related to the domain fraction $x_{pos}$. Peaks with relatively large Miller index L (e.g. L=4) are especially sensitive to $x_{pos}$, since at high L oppositely polarized domains scatter nearly out of phase, resulting in a minimum in the intensity when equal fractions of positive and negative domains are present ($x_{pos}=0.5$).

FIGS. 4A and 4B show the lattice parameter and domain fraction as a function of $pO_2$ for temperatures of 645 and 735 K. FIG. 4C shows the calculated net polarization (20). The behavior of the lattice parameter in FIG. 4A is bistable, with a $pO_2$ dependence that changes sign depending on whether the sample is initially equilibrated at high or low $pO_2$. The behavior is analogous to the standard "butterfly loop" which occurs when the polarization of a ferroelectric film is switched using an external voltage applied across electrodes. Here the external $pO_2$ is producing the electric field in the film. The change from point I to II is due to piezoelectric compression of the positively polarized film by an increasingly negative field, while the state change from point II to III is the transition from positive to negative polarization via formation of a mixed domain state and the growth of negatively polarized domains. In the second half cycle, the transition from III to IV is due to piezoelectric compression of the negatively polarized film under increasingly positive field; finally, from IV to I the film switches back to positive polarization.

Figure 4:
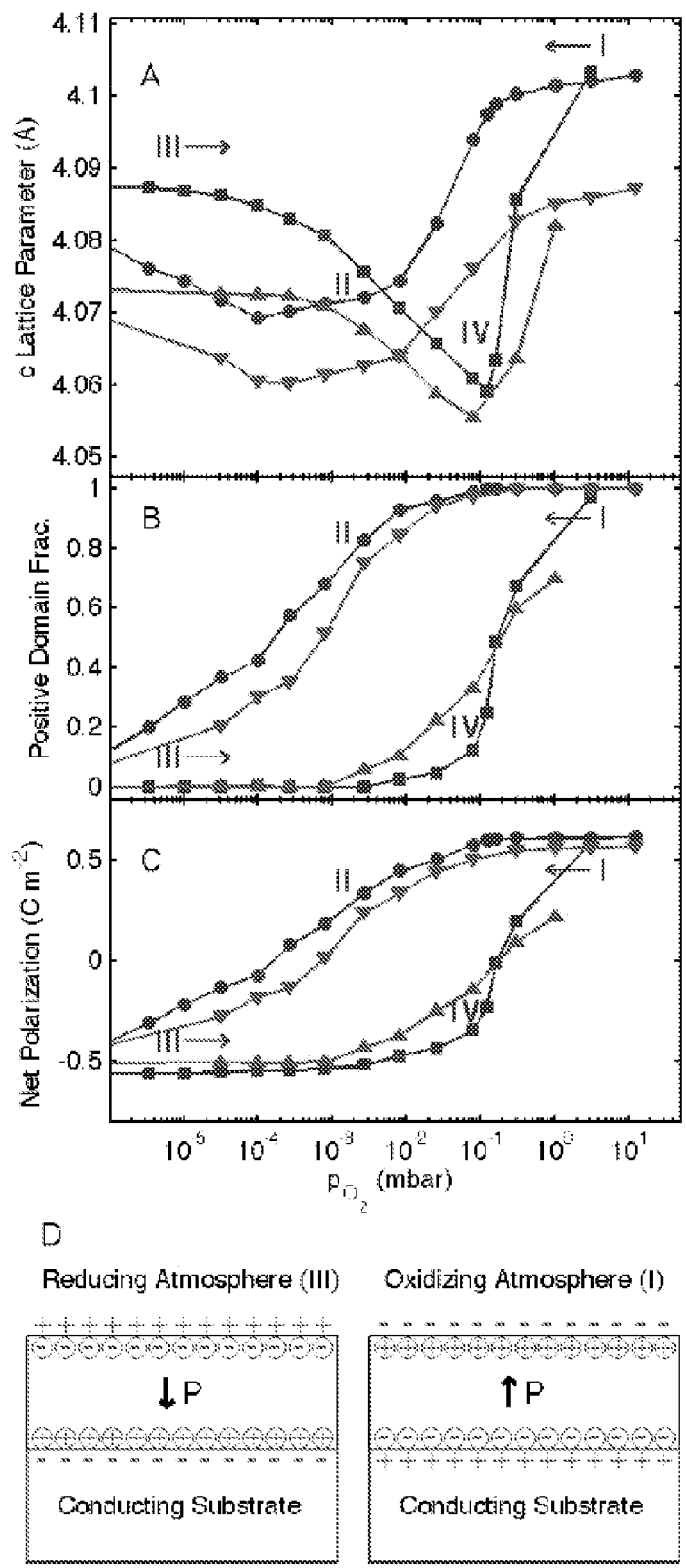
FIG. 4. Shows bistability of lattice parameter, domain fraction, and net polarization as a function of oxygen partial pressure $pO_2$ for a 10 nm thick $PbTiO_3$ film on SrRuO3/SrTiO3. Blue and red curves are for temperatures of 645 K and 735 K, respectively. Circles and downward-pointing triangles are obtained when decreasing from high $pO_2$; squares and upward-pointing triangles when increasing from low $pO_2$. To fully switch the sample to negative polarization, oxygen flow was set to zero, resulting in an indeterminate low value of $pO_2$ indicated by lines leading off scale on left. (A) Measured c lattice parameter, showing chemical butterfly loops. (B) Positive domain fraction and (C) net polarization obtained from fits of L scans to a detailed structural model. (D) Illustration of chemical switching of polarization, showing fully polarized extreme states I and III. Circled and uncircled symbols represent the bound charges of the ferroelectric and the free compensating charges, respectively.

The results in FIGS. 4A-C indicate that the ferroelectric film can be fully switched between monodomain states with positive and negative polarization orientations by varying the $pO_2$ of the ambient, as illustrated in FIG. 4D. The change in sign of the lattice parameter dependence on $pO_2$ demonstrates that the film polarization is opposite when equilibrated at high or low $pO_2$. We observe that the bistable behavior is repeatable, provided that the excursions in $pO_2$ are large enough to fully switch the sample. For small changes in $pO_2$ in the non-switching regions ($x_{pos}$ near unity or zero), the measured strain remains on one of the two branches of the loop with no hysteresis, and equilibration is relatively rapid (within minutes). While a $pO_2$ of 3.0 mbar is sufficient to fully switch the sample to positive polarization, full switching to negative polarization could be accomplished most rapidly at $pO_2$ values below the minimum controllable value in the apparatus ($3.3 \times 10^{-6}$ mbar). For the data in FIG. 4, full switching to negative polarization was obtained by setting the oxygen input flow to zero, giving a value of $pO_2$ less than $10_{-7}$ mbar. Similar behavior is observed at both temperatures, with overall smaller c lattice parameters at the higher temperature consistent with those expected as the Curie point $T_C \approx 920$ K (10) is approached and polarization magnitudes decrease. We observe that there is no bistability in c as a function of $pO_2$ at T=950 K, in the paraelectric phase above $T_C$.

Figure 5:
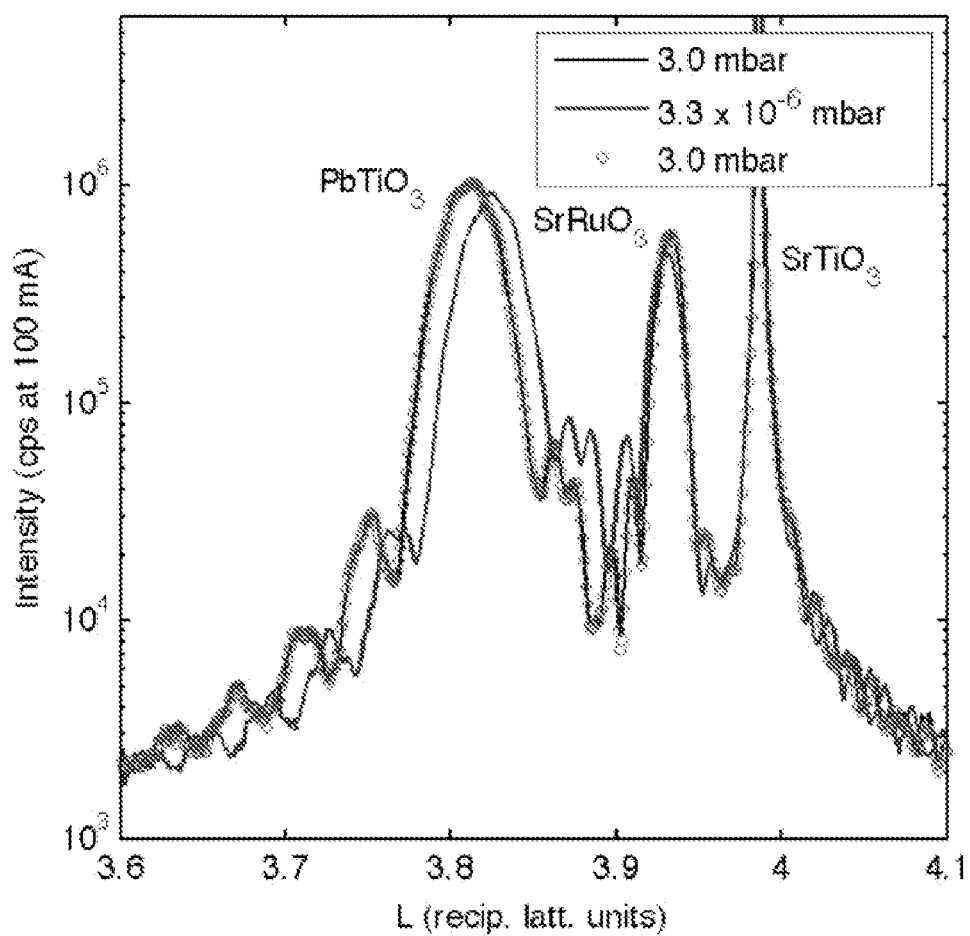
FIG. 5. Shows X-ray scattering patterns along the L direction through the $PbTiO_3$, $SrRuO_3$, and $SrTiO_3$ 304 peaks from films equilibrated under oxidizing ($pO_2$=3.1 mbar) and reducing ($pO_2$=3.3×10$^{-6}$ mbar) ambients at 645 K. Black curve: before FIG. 6 switch, oxidizing condition. Blue curve: after switching to reducing condition. Red points: after FIG. 3 switch, oxidizing condition. Values of L are given in reciprocal lattice units of the SrTiO3 substrate at 298 K, which has a cubic lattice parameter of 3.9051 Å.

Further evidence that the polarization switching is reversible (i.e. returns to an identical state) is given in FIG. 5, which shows distributions of scattering in the L direction (L scans) through the 304 Bragg peaks. The black, blue and red curves, respectively, were taken with the sample equilibrated (i) at high $pO_2$ (3.0 mbar), before a switching cycle; (ii) at low $pO_2$ ($3.3 \times 10^{-6}$ mbar), and (iii) again at $pO_2$=3.0 mbar, after the switching cycle. The three main peaks are the 304 Bragg reflections from the $PbTiO_3$, $SrRuO_3$, and $SrTiO_3$, respectively. The $PbTiO_3$ and $SrRuO_3$ peaks are broadened and surrounded by fringes arising from the finite film thickness and film/substrate interference effects. The intensity of the $PbTiO_3$ peak and the interference fringe pattern are sensitive to the polarization structure of the film. The intensity distribution obtained after the film is switched back to the oxidizing ambient is indistinguishable from that of the initial state, indicating that the initial polarization structure is recovered. The wide extent of the finite-thickness oscillations under both high and low $pO_2$ conditions implies that the polarization and lattice parameter are approximately constant throughout the film thickness. Furthermore, the period of these oscillations indicates that the thickness of the perovskite structure $PbTiO_3$ is the same in both states. We do not observe formation of second phases, as has been seen in annealing of powders. This is consistent with the lack of a high concentration of extended defects in these films, which are necessary for significant mass transport in the bulk of the film at these temperatures. To investigate the switching dynamics, we performed real-time reciprocal space mapping of the x-ray scattering intensity around the $PbTiO_3$ 304 Bragg peak during chemical switching between high and low $pO_2$ states.

Figure 6:
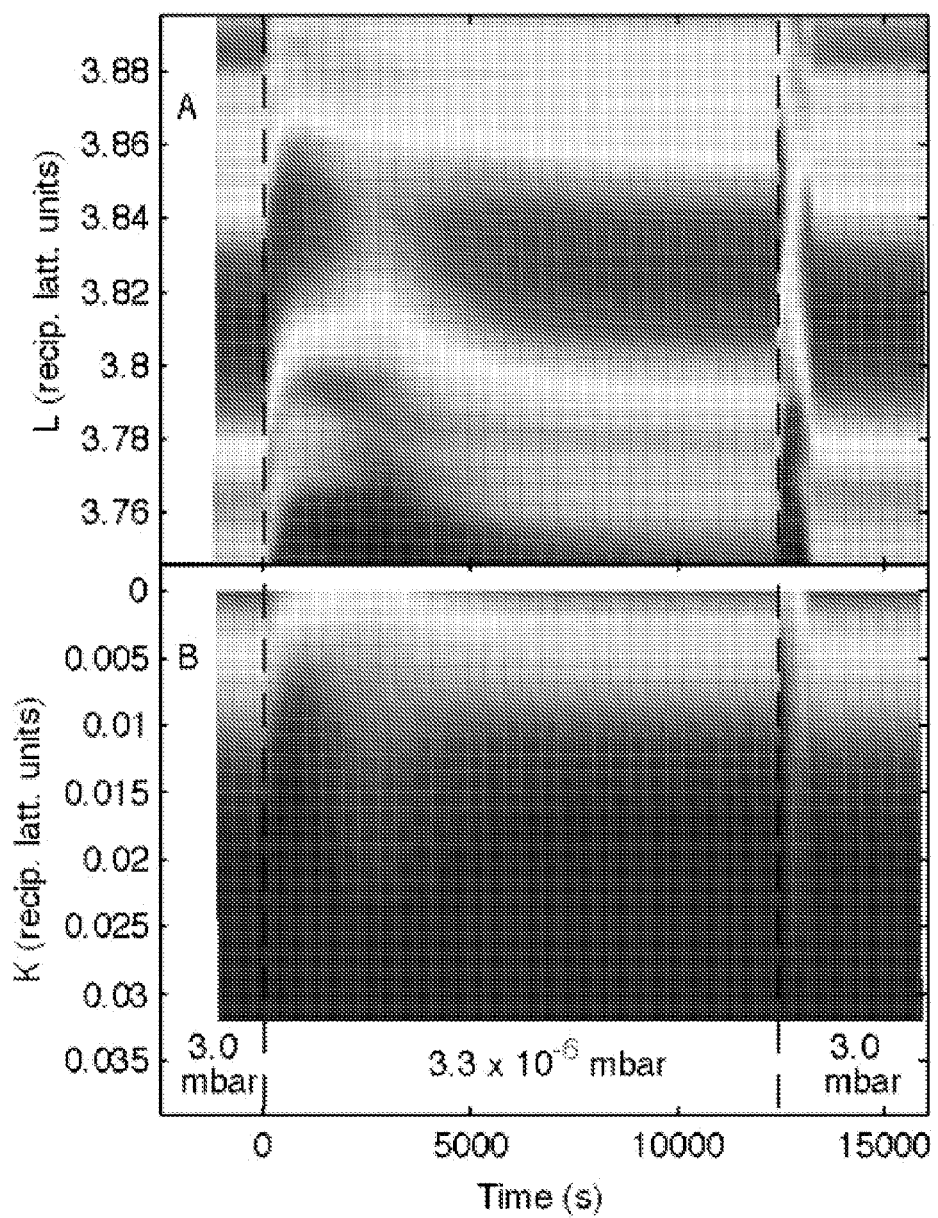
FIG. 6. Shows time evolution of x-ray scattering distribution near the $PbTiO_3$ 304 peak during switching from oxidizing ($pO_2$=3.1 mbar) to reducing ($pO_2$=3.3×10$^{-6}$ mbar) conditions and back. (A) Distribution along the L (out-of-plane) direction at H=2.989, K=0.13 (B) Distribution along the K (in-plane) direction at H=2.989, L=3.810. Redder hues indicate higher intensity (log scale).
Figure 7:
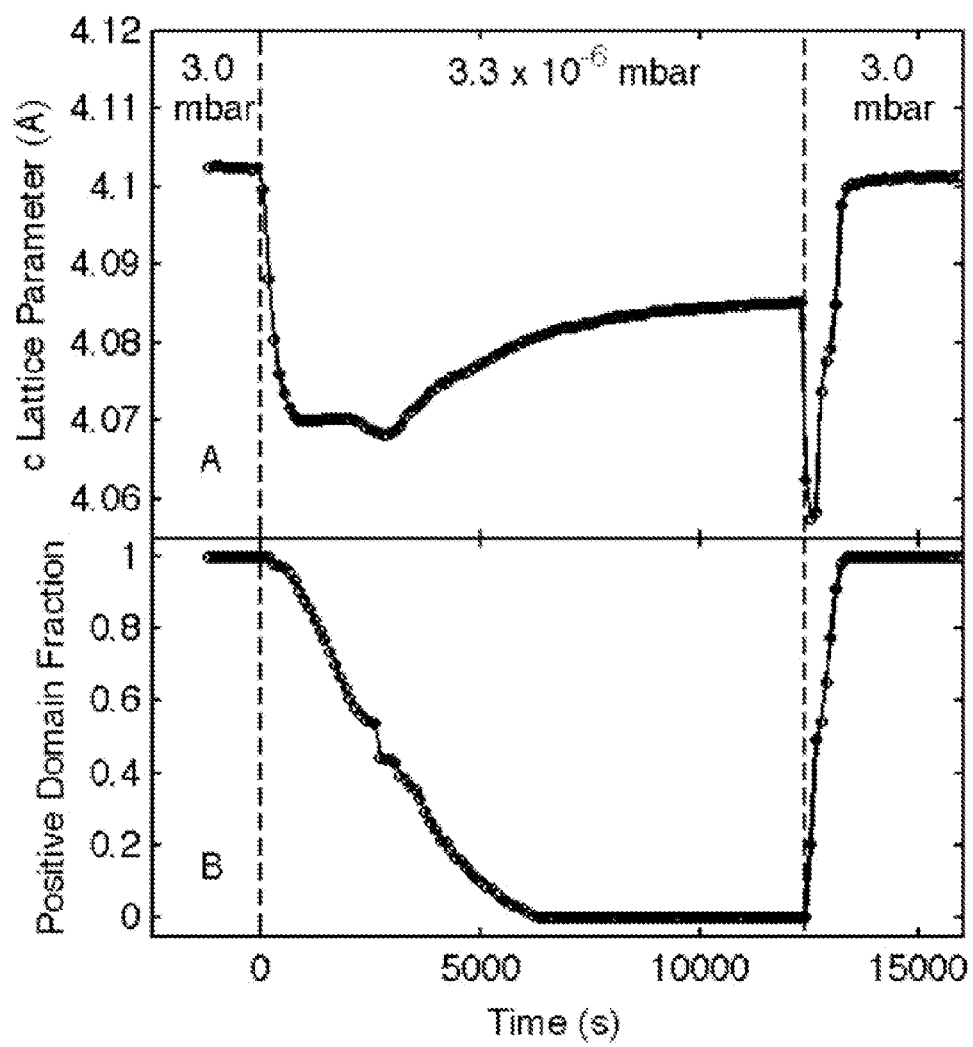
FIG. 7. Shows time dependence of quantities extracted from x-ray scattering measurements during chemical switching cycle shown in FIG. 6. (A) Lattice parameter c. (B) Positive domain fraction.

FIG. 6A shows the intensity along the L scan as a function of time during switching at a temperature of 645 K. The most intense (red) feature is the $PbTiO_3$ Bragg peak. FIG. 7 shows the time evolution of 7 the lattice parameter c and domain fraction $x_{pos}$ obtained by fitting these L scans. At time t=0, the $pO_2$ is changed from 3.0 mbar to $3.3 \times 10^{-6}$ mbar. One can see that the $PbTiO_3$ peak quickly shifts to higher L, and then its intensity decreases, reaches a minimum, and increases as it slowly shifts back to lower L. The shifts in peak position map out the strain changes of the chemical butterfly loop, while the minimum in intensity marks the point in the switching process when there are equal fractions of positive and negative domains. At t=12400 s, the atmosphere is changed back to the original high $pO_2$ environment. The sequence of peak position and intensity changes occurs again, although more rapidly, ending in a scattering pattern identical to the initial state.

FIG. 6B shows the distribution of scattering in the K (in-plane) direction as a function of time measured during the same switching cycle. The appearance of in-plane diffuse scattering in concert with the reduction in intensity at K=0 is due to the mixed-domain state during the switching process. From the extent of the scattering in K, the typical size of the domains at the midpoint of switching is determined to be ~20 nm. The switching of ferroelectric polarization indicates that the film surface strongly interacts with the surrounding chemical environment. Significant surface charge density is required to compensate the observed polarization of 0.6 $C/m_2$, which corresponds to 0.6 electronic charges per unit cell area. Previous density functional theory (DFT) calculations (10) have shown that negative ion adsorbates such as O or OH could be responsible for compensating the surface of positively polarized films under high $pO_2$ conditions.

Without being bound by any theory of operation, we hypothesize that the species responsible for compensation of negatively polarized domains under low $pO_2$ conditions are positively charged surface point defects such as oxygen vacancies. The vacancy concentration on the surface could be 8 substantially larger than that which can be tolerated in the bulk and could provide sufficient charge compensation. In fact, we observe that a surface reconstruction with 4 1 symmetry forms under reducing environments. Its intensity scales closely with the fraction of negative domains determined from the Bragg peak intensity, indicating that this reconstruction is formed by an ordering of the positively charged species compensating the surface of the negative domains.

Preliminary DFT calculations indicate that one oxygen vacancy per four surface unit cells will stabilize negative polarization in an ultrathin $PbTiO_3$ film. We are still investigating the 4×1 reconstruction using in situ x-ray scattering, and the atomic scale structure remains to be solved. The $pO_2$ dependence of the lattice parameter of the monodomain state is relatively weak at the extremes of $pO_2$ (regions I and III in FIG. 4), and becomes stronger at intermediate values (e.g. $pO_2$ between $10^{-3}$ to $10^{-1}$ mbar). We attribute this to a saturation in the concentration of charged surface species at extremes of $pO_2$. In the intermediate region, the magnitude of the variation of c with $\log(pO_2)$ is about twice as large for positively polarized monodomain films than for negatively polarized films. Since the piezoelectric coefficients for opposite polarizations are expected to have equal magnitudes, this may indicate a difference in the $pO_2$ dependence of the amount of surface charge. Chemical butterfly loops such as FIG. 4A thus provide direct evidence for the nature of the charged species compensating the surface. The switching behavior observed in this study indicates that chemistry on the ferroelectric surface plays an important role in controlling the polarization in ultrathin films without a top electrode. In particular, these results indicate that the chemical environment produces a surface potential that depends upon the composition of the ambient and is in general non-zero; this should be taken into consideration when studying size effects on ferroelectricity. It is possible to use chemical processes as a new method to create domain structures in ferroelectric films, including patterning through a lithographically produced mask. Conversely, the nature of ferroelectric film polarization can modify surface chemical reactions. The ability to electrically switch the reactivity of a surface could form the basis for new classes of thin-film chemical actuators and catalysts, offering dynamical control of reactivity and selectivity over a wide range in a single system. Adsorption of both cations and anions on nanoscale 180° stripe domains would provide a means for sub-lithographic-spatial-scale pattern formation. Further understanding of the interactions of ambients with polarization at ferroelectric surfaces promises to provide a new means for manipulating both ferroelectricity and surface chemistry.

Methods and Materials

The experiments were performed at beamline 12-ID-D of the Advanced Photon Source. The $PbTiO_3$ films were grown using metal-organic chemical vapor deposition in a chamber designed for in-situ synchrotron x-ray studies of film growth and processing (S1). $PbTiO_3$ films were grown at 930 K following procedures described previously (S2), using $SrTiO_3$ (001) substrates on which epitaxial $SrRuO_3$ films had been previously deposited by pulsed laser deposition in a separate chamber (S3). Both the $SrRuO_3$ and $PbTiO_3$ layers were fully coherently strained to the $SrTiO_3$ in-plane lattice parameter. Results presented were obtained from a sample having 10 nm thick $PbTiO_3$ and 24 nm thick $SrRuO_3$ layers, as determined by x-ray scattering. Four additional samples having $PbTiO_3$ thicknesses of 6.4, 10, 11, and 21 nm were found to have similar reversible switching behavior at various temperatures from 550 to 825 K. After growth, the sample was cooled in an oxidizing environment ($pO_2$=3.0 mbar) to the temperatures for switching studies. The residual PbO vapor pressure in the chamber was sufficient to maintain a PbO surface termination (S4). When changing the $pO_2$ of the gas mixture, the amount of $N_2$ carrier gas was adjusted to keep the total active chamber flow at 1630 sccm.

The total chamber pressure was maintained at 13 mbar. Grazing incidence scattering of 28.3 keV x-rays was used for real-time monitoring of film growth and film strain during changes in the vapor ambient. The incidence angle was ≤1.0°, except for studies of the 4×1 reconstruction, where it was ≤0.11° (the critical angle). The x-ray scattering intensity (counts per second) shown in the plots has been normalized to correspond to a fixed incident flux typical of 100 mA current in the storage ring.

The chemical butterfly loops such as FIG. 4 were traced by changing $pO_2$ in steps while performing repeated L scans through the $PbTiO_3$ 304 peak to monitor the strain changes. Dwell time at each intermediate $pO_2$ was 800 s, equivalent to ~10 scans. This was typically long enough for the lattice parameter to equilibrate, except in the switching regions. Values reported were obtained from the last scattering pattern recorded at a given $pO_2$ before the next step change. A longer dwell (e.g. 10,000 s) was used to fully switch the sample at the extreme $pO_2$ conditions before measuring the reverse half of the loop. Reciprocal space coordinates H, K, and L are given in reciprocal lattice units of the $SrTiO_3$ substrate at 298 K, which has a cubic lattice parameter of 3.9051 Å (S5). To obtain accurate $PbTiO_3$ lattice parameter values from the 304 peak position, the L offset was calibrated using the nearby Bragg peak from the $SrTiO_3$ substrate (using $SrTiO_3$ lattice parameters of 3.9194 Å and 3.9233 Å at 645 and 735 K, respectively (S5)). Evolution of the x-ray scattering distribution during switching, e.g. FIG. 7, was mapped by performing repeated scans alternating in the L and K directions while a change was made between high and low $pO_2$ conditions. We found that the switching behavior was reproducible and that equilibrated L scans were identical even after the sample had been removed from the chamber and exposed to air, as long as it was first heated to the growth temperature 930 K with a PbO overpressure sufficient to maintain the PbO terminated $PbTiO_3$ surface but below the value for PbO deposition (S4), and then cooled to lower temperatures in the same manner as done with the as-grown films.

To obtain the $PbTiO_3$ out-of-plane lattice parameter c and positive domain fraction $x_{pos}$ from the measured L scans, they were fit to scattering patterns calculated from an atomic-scale model of the $PbTiO_3$/$SrRuO_3$/$SrTiO_3$ film/substrate structure similar to that used previously (S6). The model is based on the experimental determination that the films are coherently strained to the $SrTiO_3$ in-plane lattice constant. The atomic structure of the $SrTiO_3$ and $SrRuO_3$ are modeled as simple perovskites, with centrosymmetric atomic positions. Deviations of the $PbTiO_3$ atomic positions from centrosymmetric sites are taken from literature values (S7) scaled linearly with polarization, where the polarization is obtained from the lattice parameter using Landau theory for monodomain coherently-strained $PbTiO_3$ on $SrTiO_3$ (S8,S9). This predicts that the square of polarization, $|P|^2$, is a linear function of the out-of-plane strain, $x_3$, given by $$|P|^2 = \left(Q_{11} - \frac{2s_{12}}{s_{11}+s_{12}}Q_{12}\right)^{-1}\left(x_3 - \frac{2s_{12}}{s_{11}+s_{12}}x_m\right), \quad (S1)$$

where $Q_{11}$, $Q_{12}$, $s_{11}$ and $s_{12}$ are the electrostrictive constants and elastic compliances of $PbTiO_3$, and $x_m$ is the in-plane misfit strain. As is standard for this description, strains are defined with respect to the state of zero polarization and zero stress, giving $x_3\equiv(c-a_0)/a_0$, $x_m\equiv(a_s-a_0)/a_0$, where c is the out-of-plane lattice parameter, $a_0$ is the stress-free lattice parameter of the fictitious cubic paraelectric phase extrapolated to the temperature of interest, and $_sa$ is the substrate lattice parameter. Values of these quantities obtained from measurements in the literature are summarized in reference (S8). The surface of the $PbTiO_3$ layer is assumed to be PbO terminated, consistent with the surface reconstructions found during the experiment. (We also fit the data to a $TiO_2$ terminated model, and found worse agreement.) Atomic displacements at the surface (e.g. due to surface reconstructions) were not included in the model. The interface between the $SrRuO_3$ and $PbTiO_3$ layers is assumed to have consecutive layers of SrO and $TiO_2$. The lattice parameters of both films and substrate are assumed to be constants through the thickness, and the lattice parameters of oppositely polarized domains in the PbTiO$_3$ are assumed to be the same. This is physically reasonable for domain fractions near zero or unity, where the minority domains would tend to be strained to match the majority domains, but is not necessarily a good approximation for domain fractions near 50%. Subsidiary structural parameters such as the SrRuO$_3$ lattice parameter, the layer thicknesses, roughnesses of interfaces, and atomic-scale offsets between layers were determined by fitting extended scans through the PbTiO$_3$, SrRuO$_3$, and SrTiO$_3$ 304 peaks from L=3.6 to 4.1, recorded from the positively polarized monodomain sample at pO$_2$=3.0 mbar. The polarization direction of the high-pO$_2$ monodomain state had been previously determined to be positive by piezoforce microscopy (S6). Fits to our switching results, described below, also give the same result. Figure S1 shows the fit for T=645 K. The summation of the scattering amplitudes from all layers produces the complex interference fringes.

To model the polydomain states during switching, two additional structural parameters had to be determined: the out-of-plane lattice offset at 180° domain walls, and the fraction of the scattering from oppositely polarized domains that sums incoherently, $f_{inc}$. The domain wall offset was assumed to be proportional to polarization, with a value chosen to reproduce the temperature dependence of the PbTiO$_3$ 304 peak intensity for samples with 180° stripe domains, which has a minimum at ~650 K (S10). The value of $f_{inc}$ depends on the domain size relative to the resolution of the scattering measurement.

Figure 8:
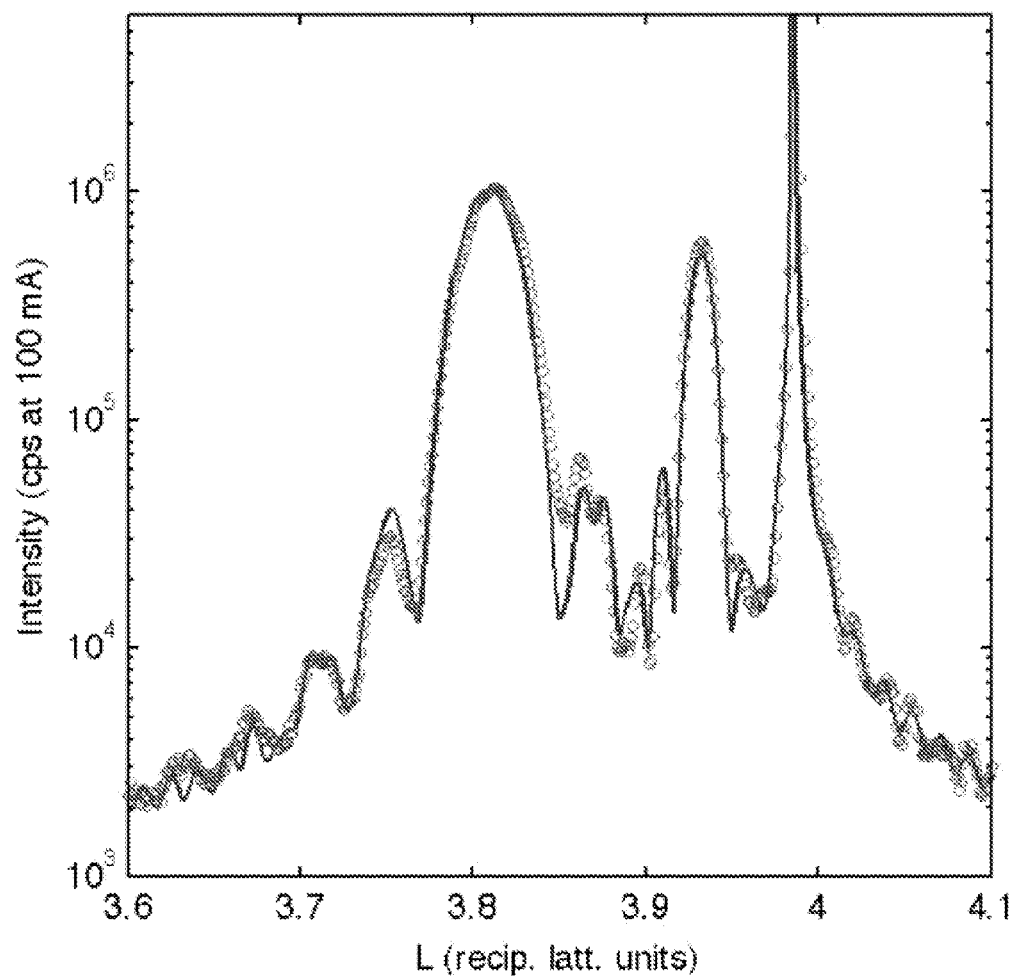
FIG. 8. Fit of model for positively polarized monodomain structure (blue line) to data (red circles) for $pO_2$=3.0 mbar, T=645 K. Peaks (from left to right) are 304 Bragg peaks of $PbTiO_3$, $SrRuO_3$, and $SrTiO_3$.

For large domains or lower resolution, the scattering will add incoherently ($f_{inc}$ approaches 1), while for small domains or higher resolution the scattering will add coherently ($f_{inc}$ approaches 0). The total intensity is given by $$I = f_{inc}[x_{pos}|F_+|^2 + (1-x_{pos})|F_-|^2] + (1-f_{inc})|x_{pos}F_+ + (1-x_{pos})F_-|^2$$

where $F_+$ and $F_-$ are the scattering amplitudes from the positively and negatively polarized domains, respectively, including the contributions from the substrate. FIG. 8 shows the intensity as a function of $x_{pos}$ for three values of $f_{inc}$. The minimum at $x_{pos}$=0.5 is due to the destructive interference between the scattering from the oppositely polarized domains. The minima in x-ray intensity we observe after changing pO$_2$ are thus signatures of domain switching. Such minima have been predicted theoretically (S11) and can also be seen in literature data taken during electrical switching experiments (e.g. see FIGS. 2 and 3 of reference (S12)). Since the depth of the minimum depends on $f_{inc}$, we choose its value to match the minimum intensity observed during switching. Values of $f_{inc}$ ranging from 0.1 to 0.5 were found, increasing for slower switching speeds, consistent with the effect expected from larger domain sizes.

Using these parameters, fits were made to the short scans from L=3.75 to 3.90 across the PbTiO$_3$ 304 peak obtained at various pO$_2$ conditions during measurements of the butterfly loops and switching dynamics. The only free parameters in these fits were the PbTiO$_3$ lattice constant x and the positive domain fraction $x_{pos}$. By using Eq. (S1) relating lattice parameter and polarization magnitude, the net polarization of the film |P|(1−2$x_{pos}$) can be calculated, as given in FIG. 4C. The position of the PbTiO$_3$ peak determines c (and thus |P|), and its intensity determines $x_{pos}$. The peak position and intensity for the data of FIG. 6 are shown in FIG. 8. A comparison with the fit results in FIG. 7 illustrates the direct relationships.

Figure 9:
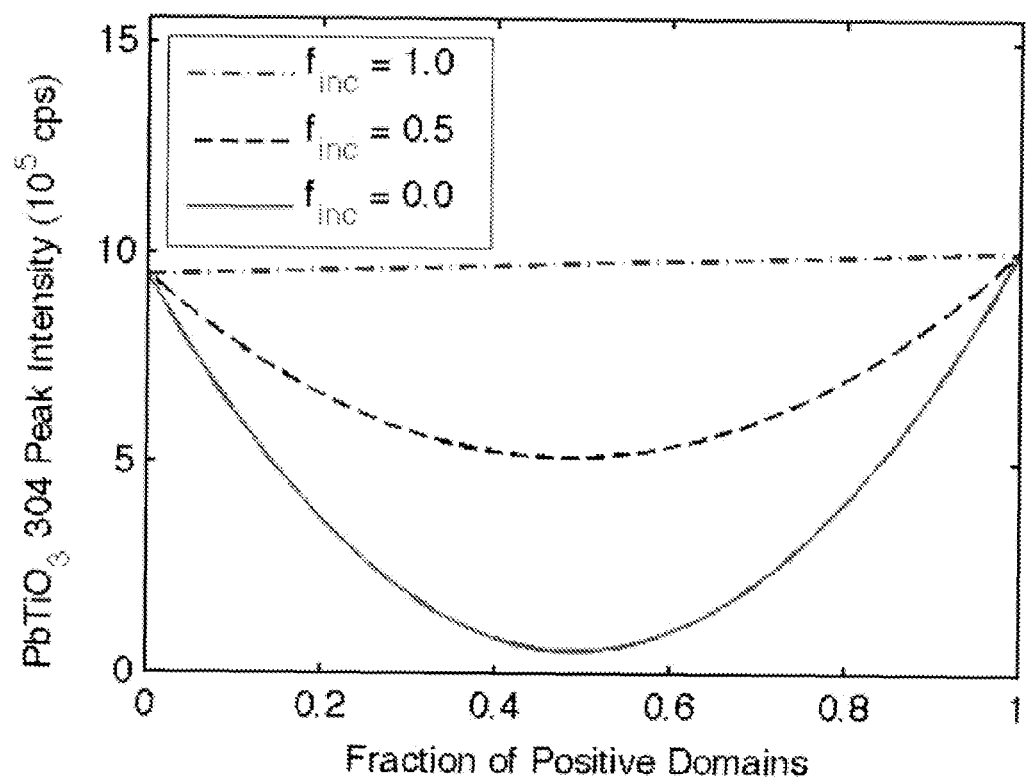
FIG. 9. Calculated intensity at $PbTiO_3$ 304 peak position as a function of positive domain fraction $x_{pos}$ for three values of incoherent fraction $f_{inc}$.

Since two values of $x_{pos}$ can give the same intensity, there is some ambiguity in which solution to choose, especially near $x_{pos}$=0.5. However, since the model includes anomalous scattering effects on atomic scattering factors, the intensity scattered from positively polarized PbTiO$_3$ is calculated to be about 6% higher than that from negative at the x-ray energy used (28.3 keV) (see FIG. 9). We observe a similar difference in the measurements for the extreme pO$_2$ cases, which provides further evidence that we are observing switching and have correctly identified the polarization directions.

We observe weak effects of the incident x-ray intensity on the measured strain. The primary effect is that higher incident intensities increase the speed with which the strain equilibrates when pO$_2$ is changed. The incident intensity also has a small, reversible effect on the equilibrium strain values, with high intensities producing ~0.1% larger strains in both positively and negatively polarized films. These strains are small compared with those measured due to pO$_2$ changes. The effects are consistent with a hypothesis that reaction of molecular O$_2$ with the surface is the rate-limiting step in the chemical switching process, and that ionizing radiation increases the rate of this reaction (in both the oxidizing and reducing directions). Further studies of the reaction chemistry occurring at the surface are underway.

To address the question of whether surface oxygen vacancies can stabilize the negatively polarized domains at low pO$_2$, and the nature of the 4×1 reconstruction observed under these conditions, we performed density functional theory (DFT) calculations using methods described previously (S6). The system size was 4 perovskite unit cells by 1 unit cell in plane, with a PbTiO$_3$ layer 2 unit cells thick on top of a SrRuO$_3$ layer 3 unit cells thick, strained to an in-plane lattice parameter appropriate to match the experimental conditions. The surface and interface terminations were the same as given above for the scattering model. One oxygen vacancy was located in the surface PbO layer.

We found that the presence of the oxygen vacancy stabilized a negative (inward) polarization in the PbTiO$_3$ film. For this 2-unit-cell-thick film, the average polarization was only about 30% of that of bulk PbTiO$_3$ at 0 K. We expect that the stabilization and polarization would increase for thicker films, such as those studied experimentally. Table 2 gives a comparison of the ground state energy $\Delta E_{DFT}$ at T=0 K and the estimated enthalpy and free energies at T=735 K. These are differences between the system with an oxygen vacancy plus a free oxygen atom, relative to the system with no oxygen vacancy (which we found to have an unpolarized ground state). As previously (S6), values are given per vapor atom, which in this case is per 4 perovskite surface unit cells. The free energy $\Delta G = \Delta G° + kT \ln pO$ has been calculated using an oxygen partial pressure of pO$_2$=1×10$_{-9}$ bar corresponding to typical experimental conditions for the 4×1 reconstruction, which gives an oxygen atom pressure at T=735 K of pO=9×10$^{-20}$ bar (S13). We expect the polar oxygen vacancy structure will become increasingly stable as the film thickness increases, by as much as −0.2 eV per added unit cell thickness (the DFT ferroelectric well depth for bulk PbTiO$_3$ per four-unit-cell area). Based on this estimate, PbTiO$_3$ films having a thickness of 4 unit cells or larger would have a negative $\Delta G$ and this be favored over the unpolarized system under the experimental T and pO$_2$ conditions.

TABLE 2

Calculated ground state (T = 0 K) energy $\Delta E_{DFT}$ and polarization $P/|P_{bulk}|$, standard enthalpy $\Delta H°$ and free energy $\Delta G°$ at T = 735 K, and free energy $\Delta G$ at T = 735 K and pO = 9 10$_{-20}$ bar for a two-unit-cell-thick PbTiO$_3$ layer containing one oxygen vacancy per four unit cell surface area.

| Compensation | $P/|P_{bulk}|$ | $\Delta E_{DFT}$ (eV) | $\Delta H°$ (eV) | $\Delta G°$ (eV) | $\Delta G$ (eV) |
|---|---|---|---|---|---|
| O vacancy (4 × 1) | −0.3 | 4.36 | 4.42 | 3.05 | 0.27 |

REFERENCES METHODS AND MATERIALS

S1. G. B. Stephenson et al., *MRS Bulletin* 24 (1), 21 (January 1999).
S2. M. V. Ramana Murty et al., *Appl. Phys. Lett.* 80, 1809 (2002).
S3. J. Choi, C. B. Eom, G. Rijnders, H. Rogalla, D. H. A. Blank, *Appl. Phys. Lett.* 79, 1447 (2001).
S4. A. Munkholm et al., *Phys. Rev. Lett.* 88, 016101 (2002).
S5. *Thermophysical Properties of Matter*, edited by Y. S. Touloukian (Plenum, N.Y., 1977) Vol. 13. p. 670.
S6. D. D. Fong et al., *Phys. Rev. Lett.* 96, 127601 (2006).
S7. A. M. Glazer and S. A. Mabud, *Acta Crystallogr. B* 34, 1065 (1978).
S8. G. B. Stephenson, K. R. Elder, *J. Appl. Phys.* 100, 051601 (2006).
S9. N. A. Pertsev, A. G. Zembilgotov, A. K. Tagantsev, *Phys. Rev. Lett.* 80, 1988 (1998).
S10. G. B. Stephenson, et al., *Physica B* 336, 81 (2003).
S11. C. Thompson, C. M. Foster, J. A. Eastman, G. B. Stephenson, *Appl. Phys. Lett.* 71, 3516 (1997).
S12. A. Grigoriev et al., *Phys. Rev. Lett.* 96, 187601 (2006).
S13. Calculated from gas phase thermochemical data in M. W. Chase, Jr., NIST-JANAF Themochemical Tables, Fourth Edition, *J. Phys. Chem. Ref. Data*, Monograph 9, 1 (1998). Available online in NIST Standard Reference Database Number 69 (June 2005 Release) at http://webbook.nist.gov/chemistry.

What is claimed is:

1. A method of reversibly switching the polarization of a ferroelectric film, comprising: changing a chemical environment in contact with one surface of the ferroelectric film.

2. The method of claim 1, wherein the chemical environment is changed by controlling the oxygen partial pressure in contact with the ferroelectric film.

3. The method of claim 2, wherein the change in oxygen partial pressure induces an outward or inward polarization, respectively, in the ferroelectric film.

4. The method of claim 1, wherein the ferroelectric film comprises a perovskite thin-film.

5. The method of claim 4, wherein the perovskite thin-film comprises PbTiO$_3$.

6. The method of claim 1 wherein the ferroelectric film is supported on a conducting substrate.

7. The method of claim 1 wherein the ferroelectric film is thinner than 10 nm.

* * * * *

UNITED STATES PATENT AND TRADEMARK OFFICE
CERTIFICATE OF CORRECTION

PATENT NO.        : 8,603,573 B2                          Page 1 of 1
APPLICATION NO. : 12/517163
DATED             : December 10, 2013
INVENTOR(S)       : Rappe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1146 days.

Signed and Sealed this
Twenty-second Day of September, 2015

Michelle K. Lee
*Director of the United States Patent and Trademark Office*